United States Patent
Yang et al.

(10) Patent No.: US 8,674,438 B2
(45) Date of Patent: Mar. 18, 2014

(54) SEMICONDUCTOR DEVICES HAVING STRESSOR REGIONS AND RELATED FABRICATION METHODS

(71) Applicant: GLOBALFOUNDRIES, Inc., Grand Cayman, KY (US)

(72) Inventors: Bin Yang, Mahwah, NJ (US); Man Fai Ng, Poughkeepsie, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/765,474

(22) Filed: Feb. 12, 2013

(65) Prior Publication Data

US 2013/0153927 A1    Jun. 20, 2013

Related U.S. Application Data

(62) Division of application No. 12/814,346, filed on Jun. 11, 2010, now Pat. No. 8,394,691.

(51) Int. Cl.
*H01L 29/04* (2006.01)

(52) U.S. Cl.
USPC ........... 257/336; 257/346; 257/347; 257/613; 257/627; 257/E29.104; 257/E29.269

(58) Field of Classification Search
USPC ................. 257/336, 346, 347, 349, 613, 627, 257/E29.003, E29.104, E29.269
See application file for complete search history.

(56) References Cited

U.S. PATENT DOCUMENTS

| | | | |
|---|---|---|---|
| 7,554,110 B2 | 6/2009 | Yu et al. | |
| 7,939,852 B2 | 5/2011 | Pal et al. | |
| 2010/0015814 A1 | 1/2010 | Chen et al. | |
| 2011/0303980 A1 | 12/2011 | Sultan et al. | |

*Primary Examiner* — Minh-Loan T Tran
(74) *Attorney, Agent, or Firm* — Ingrassia Fisher & Lorenz, P.C.

(57) ABSTRACT

Apparatus for semiconductor device structures and related fabrication methods are provided. One method for fabricating a semiconductor device structure involves forming a gate structure overlying a region of semiconductor material, wherein the width of the gate structure is aligned with a <100> crystal direction of the semiconductor material. The method continues by forming recesses about the gate structure and forming a stress-inducing semiconductor material in the recesses.

20 Claims, 4 Drawing Sheets

SEMICONDUCTOR DEVICES HAVING STRESSOR REGIONS AND RELATED FABRICATION METHODS

PRIORITY CLAIM

This is a divisional of U.S. application Ser. No. 12/814,346, filed Jun. 11, 2010.

TECHNICAL FIELD

Embodiments of the subject matter generally relate to semiconductor device structures and related fabrication methods, and more particularly, embodiments of the subject matter relate to devices and related fabrication methods for semiconductor devices having stressor regions.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

Epitaxial stressor regions are frequently used to increase the mobility of carriers in the channels of the MOS transistors, and thereby achieve a corresponding improvement in performance. However, as device geometries shrink, non-uniformities and variations in the stressor regions have a relatively larger impact on transistor performance.

BRIEF SUMMARY

A method is provided for fabricating a semiconductor device structure on a region of semiconductor material. The method comprises forming a gate structure overlying the region of semiconductor material, forming recesses about the gate structure, and forming a stress-inducing semiconductor material in the recesses. The width of the gate structure is aligned with a <100> crystal direction of the semiconductor material.

In another embodiment, a method of fabricating a semiconductor device structure on a region of silicon material is provided. The method comprises forming a gate structure overlying the region of silicon material and etching the silicon material using the gate structure as an etch mask. The width of the gate structure is aligned with a <100> crystal direction of the silicon material such that the recesses have bottom surfaces and sidewall surfaces comprised of equivalent crystal planes of the silicon material. The method further comprises forming stressor regions in the recesses.

In another embodiment, another apparatus for a semiconductor device is provided. The semiconductor device comprises a region of semiconductor material, a gate structure overlying the region of semiconductor material, and first and second stressor regions formed in the region of semiconductor material about the gate structure. A width of the gate structure is aligned with a <100> crystal direction of the semiconductor material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to fabricate MOS transistor devices that include stressor regions to increase mobility of carriers in the channel region. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Although the fabrication processes described herein may be utilized to fabricate PMOS transistor devices, preferred embodiments fabricate NMOS transistor devices having silicon carbon stressor regions in accordance with the processes described herein. Various steps in the fabrication of semiconductor devices are well known and so, in the interest of brevity, many conventional steps will only be mentioned briefly herein or will be omitted entirely without providing the well known process details.

Figure 1:
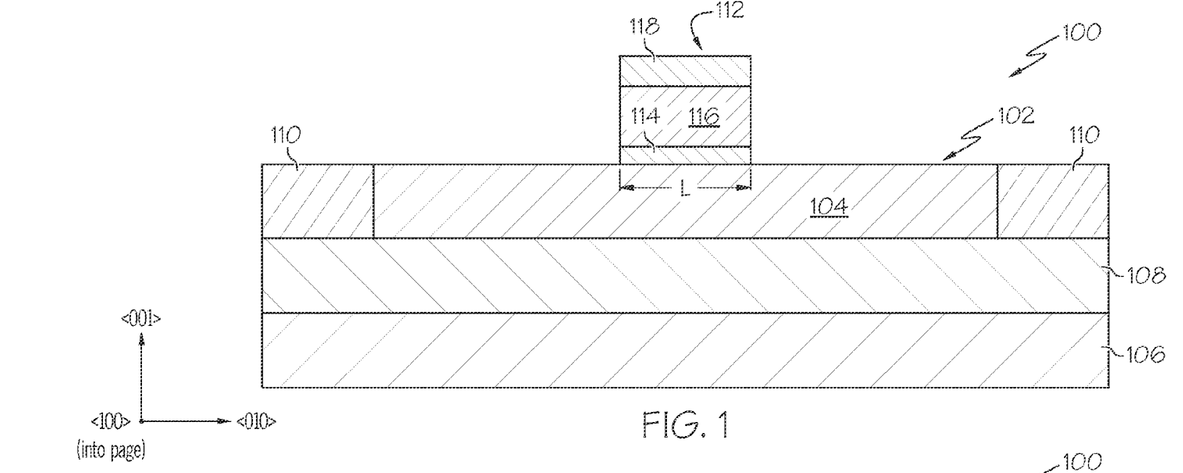
FIGS. 1-6 are cross-sectional views and top views that illustrate a semiconductor device structure and methods for fabricating the semiconductor device structure in exemplary embodiments.
Figure 2:
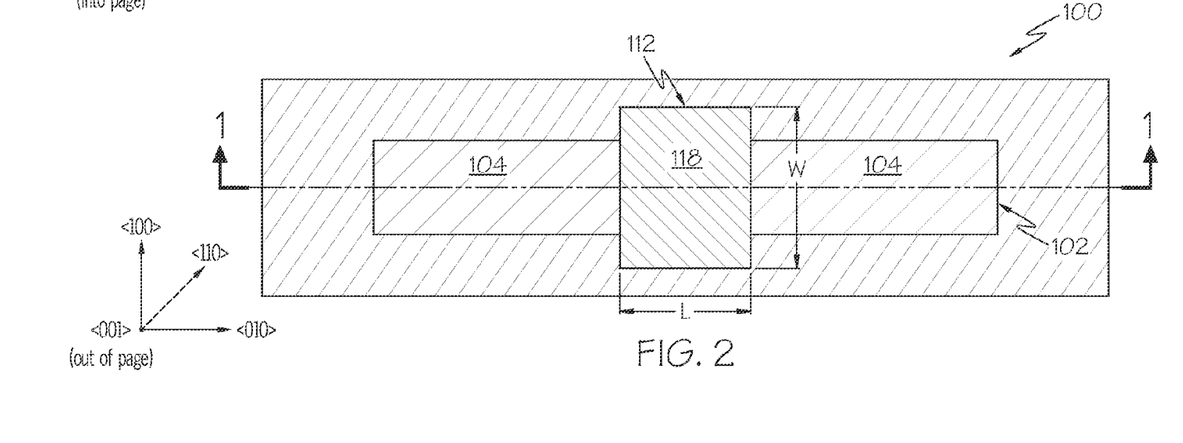

Referring now to FIG. 1 and FIG. 2, in an exemplary embodiment, the fabrication process begins by forming a gate structure 112 overlying an isolated region 102 of semiconductor material 104, resulting in the semiconductor device structure 100. FIG. 2 depicts a top view of the semiconductor device structure 100 after forming the gate structure 112 overlying the isolated region 102 of semiconductor material 104, and FIG. 1 depicts a cross-sectional view of the semiconductor device structure 100 of FIG. 2 along the line 1-1. In an exemplary embodiment the electrically isolated region 102 is formed from a substrate (or wafer) of semiconductor material 104. The semiconductor material 104 is preferably realized as a monocrystalline silicon material, and accordingly, for convenience, the semiconductor material 104 is alternatively referred to herein as silicon material. The silicon material 104 has a crystallographic orientation indicated by the reference axes in FIGS. 1-2 illustrating the Miller indices for the families of crystal directions in the crystalline structure for a (100) wafer of silicon material 104.

As best illustrated by FIG. 2, in an exemplary embodiment, the width (W) of the gate structure 112 is aligned with the <100> family of crystal directions of silicon material 104 and the length (L) of the gate structure 112 is aligned with the <010> family of crystal directions of silicon material 104. In other words, the width of the gate structure 112 is orthogonal to the <010> crystal direction and the length of the gate structure 112 is orthogonal to the <100> crystal direction. As used herein, the <100> crystal direction should be understood as referring to the family of equivalent crystal directions including the [100], [010], and [001] crystal directions, and the <010> crystal direction should be understood as referring to the family of equivalent crystal directions including the [010], [100], and [001] crystal directions. In this regard, although the illustrated embodiment depicts the width (W) of the gate structure 112 aligned with the [100] crystal direction, in other embodiments, the width (W) of the gate structure 112 may be aligned with the [010] crystal direction or the [001] crystal direction. The width (W) and length (L) of the gate structure 112 influence the width and length of the channel region of semiconductor material 104 underlying the gate structure 112 in a conventional manner, as will be appreciated in the art. The illustrated gate alignment in FIGS. 1-2 is in contrast to the conventional gate alignment, wherein the width of the gate structure is aligned with the <110> crystal direction, typically referenced by a notch on the wafer of silicon material 104. Thus, in the present embodiment, if the wafer of silicon material 104 has a notch indicating the <110> crystal direction, as prescribed by some Semiconductor Equipment and Materials International (SEMI) standards, the patterns and/or masks for the gate structure 112 are rotated by 45 degrees of rotation counterclockwise about the <001> direction with respect to the notch prior to forming the gate structure 112 having a width (W) aligned with the [100] crystal direction. In an alternative embodiment, the patterns and/or masks for the gate structure 112 are rotated by 45 degrees of rotation clockwise about the <001> direction with respect to the notch prior to forming a gate structure 112 having a width aligned with the [010] crystal direction and a length aligned with the [100] crystal direction.

Depending on the embodiment, the semiconductor substrate may be realized as a silicon-on-insulator (SOI) substrate or a bulk semiconductor substrate. The illustrated embodiment in FIG. 1 depicts a SOI substrate comprising a support layer 106, a layer of insulating material 108 on the support layer 106, and the layer of silicon material 104 on the layer of insulating material 108. It should be appreciated that in alternative embodiments, when the fabrication process described herein is used to create devices from a bulk semiconductor substrate, the support layer 106 and/or insulating material 108 need not be present. The insulating material 108 may be realized as an oxide layer formed in a subsurface region of the semiconductor substrate, also known as a buried oxide (BOX) layer. For example, the layer of insulating material 108 may be formed by an ion implantation process followed by high temperature annealing to create a buried layer of silicon dioxide. In other embodiments, an oxidized wafer may be bonded to the support layer 106 from a donor wafer to obtain the layer of insulating material 108 between the support layer 106 and a layer of silicon material 104 overlying the layer of insulating material 108.

In an exemplary embodiment, the electrically isolated region 102 is formed by performing shallow trench isolation (STI) on the semiconductor substrate, resulting in a region of an insulating material 110 about the periphery of the isolated semiconductor region 102. The shallow trench isolation may be formed in a conventional manner, for example, by forming a masking material, such as a nitride material (e.g., the pad nitride), overlying the silicon material 104, patterning the masking material to leave exposed portions of the underlying silicon material 104, etching trenches into the exposed portions of the silicon material 104 using the masking material as an etch mask, and forming the insulating material 110 in the trenches to electrically isolate region 102. The trenches are etched to a depth at least equal to the thickness of the layer of silicon material 104 to expose the underlying insulating material 108. After forming trenches, a layer of insulating material 110 is formed in the trenches by conformably depositing a layer of an oxide material, such as silicon dioxide, to a thickness greater than the depth of the trenches relative to the upper surface of the silicon material 104. After forming the oxide material 110 in the trenches, chemical-mechanical planarization (CMP) may be used to remove any oxide material 110 overlying the isolated region 102 and obtain a substantially planar surface. The remaining oxide material 110 may hereinafter be referred to for convenience, but without limitation, as the field oxide. As shown in FIG. 2, the field oxide 110 borders the perimeter of the isolation region 102. It should be appreciated that although the subject matter is described herein in the context of shallow trench isolation, in practice, the electrically isolated region 102 may be formed using another isolation process (e.g., local oxidation of silicon) known in the art.

After electrically isolating the region 102 of silicon material 104, if the silicon material 104 is undoped, the fabrication process continues by implanting ions into the isolated semiconductor region 102 to achieve a desired dopant profile for the channel region of a MOS transistor structure subsequently formed on the isolated semiconductor region 102. For example, for an NMOS transistor, a P-well may be formed by implanting P-type ions, such as boron ions, into the silicon material 104 prior to forming the gate structure 112. This ion implantation step may include several different, separate implantations at different energies and different doses to achieve a desired doping profile, as will be appreciated in the art. In other embodiments, the silicon material 104 may be doped prior to electrically isolating region 102, as will be appreciated in the art.

Although one or more additional process steps may be performed next, in an exemplary embodiment, the fabrication process continues by forming a gate structure 112 overlying the isolated region 102 of silicon material 104. The gate structure 112 functions as a gate electrode for a MOS transistor structure subsequently formed on the isolated region 102. Although FIGS. 1-2 depict a single gate structure overlying the isolated semiconductor region 102, in practice, any number of gate structures may be formed on the isolated semiconductor region 102, and the subject matter is not intended to be limited to any particular number of gate structures formed on the isolated region of semiconductor material. As described above, the width (W) of the gate structure 112 is aligned with the <100> crystal direction of silicon material 104 and the length (L) of the gate structure 112 is aligned with the <010> crystal direction of silicon material 104.

The gate structure 112 can be created using a conventional gate stack module or any combination of well-known process steps. As best shown in FIG. 1, the gate structure 112 preferably includes at least one layer of dielectric material 114, at least one layer of conductive material 116, and at least one layer of a dielectric capping material 118. For example, the gate structure 112 may be formed by depositing one or more layers of dielectric material 114, such as an oxide material or a high-k dielectric material, overlying the semiconductor region 102 preferably to a thickness less than about 3 nm. After forming the gate dielectric material 114, fabrication of gate structure 112 may continue by depositing one or more layers of conductive gate electrode material 116, such as a metal material or polycrystalline silicon (polysilicon), overlying the layer(s) of dielectric material 114, preferably to a thickness within the range of about 0.4 to 5.0 nm. After forming the gate electrode material 116, fabrication of gate structure 112 may continue by depositing one or more layers of insulating material 118, such as a nitride material or an oxide material, overlying the conductive material 116, preferably to a thickness within the range of about 5 to 50 nm. Portions of the dielectric material 114, conductive material 116, and capping material 118, are selectively removed, preferably using an anisotropic etchant, to define the gate structure 112. The remaining portions of capping material 118 function as a gate cap that protects the underlying conductive material 116 during subsequent process steps. In this regard, in some embodiments, the conductive material 116 may be doped prior to forming the capping material 118. In an exemplary embodiment, the length (L) of the gate structure 112 is less than about 30 nm. It should be understood that various numbers, combinations and/or arrangements of materials may be utilized for the gate structure in a practical embodiment, and the subject matter described herein is not limited to any particular number, combination, or arrangement of gate material(s) in the gate structure.

Figure 3:
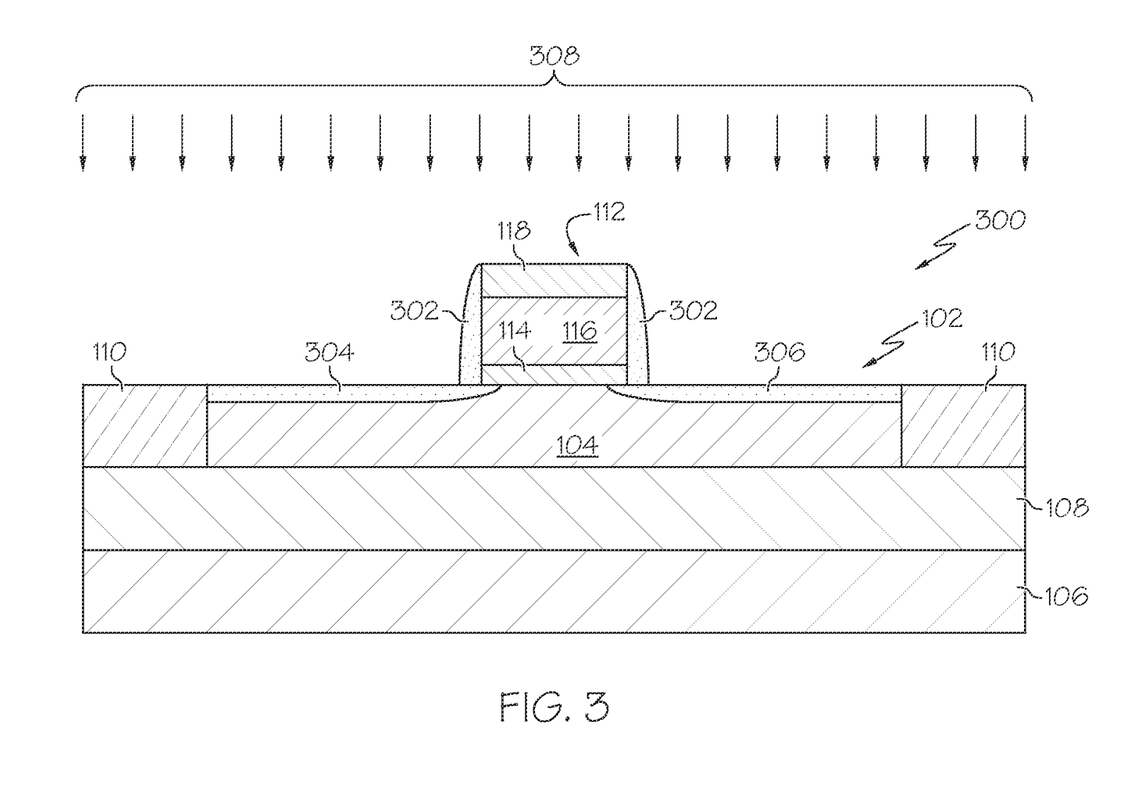

Referring now to FIG. 3, in an exemplary embodiment, the fabrication process continues by forming a spacer 302 about sidewalls of the gate structure 112 and forming spaced-apart source and drain extension regions 304, 306 in the semiconductor material 104, resulting in semiconductor device structure 300. The source/drain extension regions 304, 306 are formed by appropriately impurity doping the semiconductor material 104 in a known manner, for example, by ion implantation of dopant ions, illustrated by arrows 308, using the gate structure 112 and spacer 302 as an implantation mask and subsequent thermal annealing. By using the gate structure 112 and spacer 302 as an ion implant mask, the ion implant boundaries are vertically aligned with the spacer 302 due to the orthogonal orientation of ions 308 with respect to the surface of the semiconductor material 104. In this regard, the width of the spacer 302 controls the proximity to the channel region for the ion implant boundaries, wherein extent to which the source/drain extension regions 304, 306 extend underneath the spacer 302 and/or gate structure 112 depends on the diffusion rate of the dopant ions in the semiconductor material 104, as will be appreciated in the art. Additionally, the spacer 302 defines the sidewalls of subsequently formed recesses in the silicon material 104, as described in greater detail below in the context of FIGS. 4-5.

The spacer 302 is preferably formed by forming a layer of insulating material overlying the gate structure 112 and selectively removing portions of the insulating material. The insulating material may be a nitride material, such as silicon nitride, or an oxide material (or a combination of a nitride material and an oxide material) that is conformably deposited overlying semiconductor device structure 300 of FIGS. 3-4 in a known manner by, for example, atomic layer deposition (ALD), chemical vapor deposition (CVD), low pressure chemical vapor deposition (LPCVD), sub-atmospheric chemical vapor deposition (SACVD), or plasma-enhanced chemical vapor deposition (PECVD). The insulating material is preferably deposited to a thickness chosen such that the width of the portions of the spacer 302 in contact with the semiconductor region 102 is within the range of about 5 nm to about 15 nm. The spacer 302 is preferably formed by anisotropically etching the insulating material using processes well known in the art. For example, a spacer 302 formed from a silicon nitride material may be created using plasma-based RIE (reactive ion etching), using commonly known etchant chemistries.

As set forth above, the source/drain extension regions 304, 306 are preferably formed by implanting ions of a conductivity-determining impurity to a desired depth and/or sheet resistivity using the gate structure 112, the spacer 302, and the field oxide 110 as an implantation mask. In an exemplary embodiment, the source/drain extension regions 304, 306 are shallow and have a junction depth of about 15 nm to 35 nm, preferably around 25 nm, and have a dopant concentration in the range of about $1\times10^{13}/cm^3$, to about $1\times10^{17}/cm^3$, and preferably about $1\times10^{15}/cm^3$ to provide a sheet resistivity of about 600 ohms per square. However, it will be appreciated that the junction depth and/or resistivity of the source/drain extension regions will vary depending on the needs of the particular device. The conductivity-determining impurity type of the implanted ions is different from the conductivity type of the silicon material 104. For example, when the silicon material 104 is doped with P-type ions to provide a P-well region, the source/drain extension regions 304, 306 are formed by implanting N-type ions (illustrated by arrows 308), such as arsenic ions, into the exposed surfaces of silicon material 104. After implanting ions 308, the fabrication process continues by performing thermal annealing to activate the source/drain extension regions 306. In an exemplary embodiment, the semiconductor device structure may be heated to a temperature between about 900° C. to about 1100° C. by performing either a laser scribe anneal, flash anneal, or rapid thermal anneal to activate the source/drain extension regions 304, 306. Heating the semiconductor device structure also encourages or otherwise promotes diffusion of the dopant ions into the semiconductor material 104 and underneath the spacer 302 and/or gate structure 112, resulting in a dopant profile for the source/drain extension regions 304, 306 illustrated by FIG. 3. The remaining P-type region of semiconductor material 104 underlying the gate structure 112 and disposed between the source/drain extension regions 304, 306 provides the channel region of the NMOS transistor structure including gate structure 112, as will be appreciated in the art.

Figure 4:
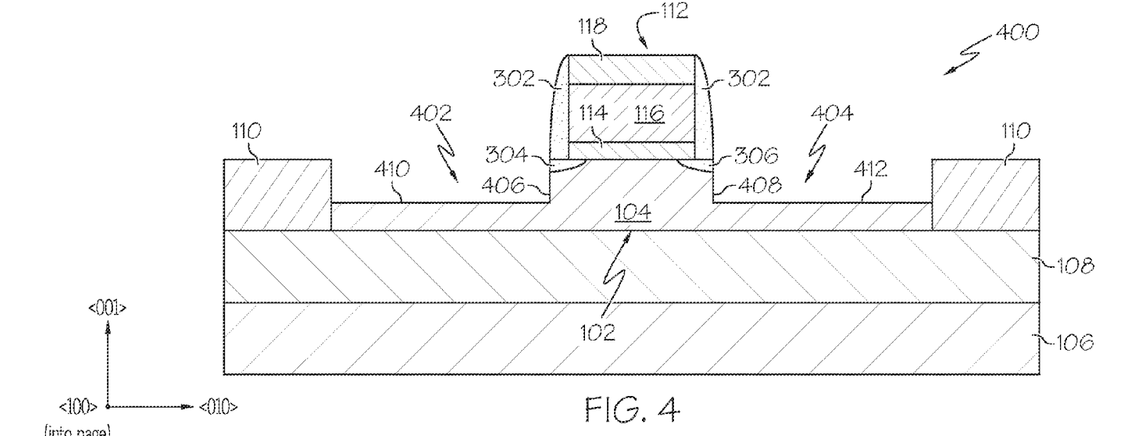
Figure 5:
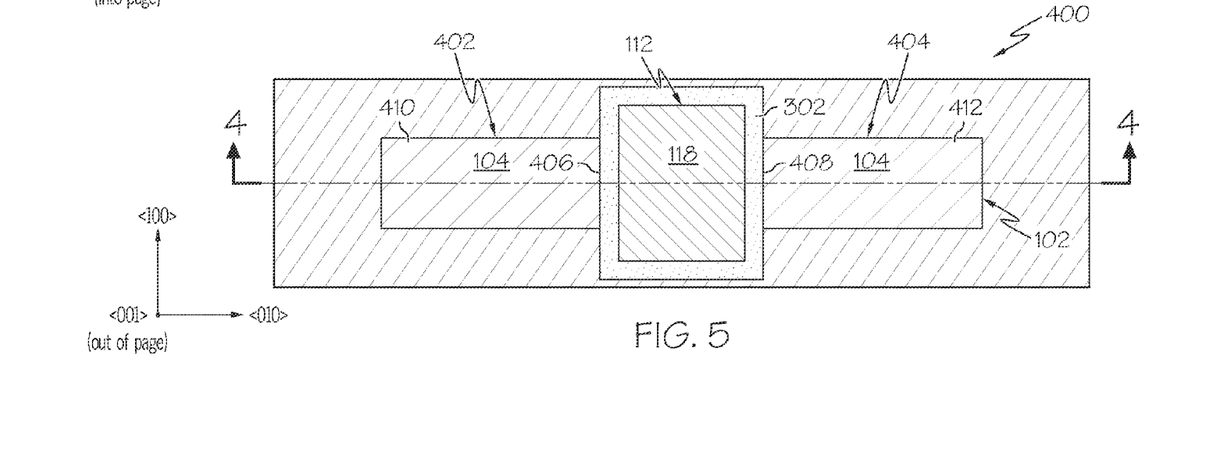

Referring now to FIGS. 4-5, although one or more additional process steps may be performed next, in an exemplary embodiment, in an exemplary embodiment, the fabrication process continues by forming recesses (or cavities) 402, 404 in the exposed portions of silicon material 104, resulting in semiconductor device structure 400. FIG. 5 depicts a top view of the semiconductor device structure 400 after forming the recesses 402, 404, and FIG. 4 depicts a cross-sectional view of the semiconductor device structure 400 of FIG. 5 along the line 4-4. The recesses 402, 404 are preferably formed in the isolated semiconductor region 102 by anisotropically etching the exposed portions of silicon material 104 using the gate structure 112 and spacer 302 as an etch mask. In this manner, the recesses 402, 404 are vertically aligned with the spacer 302, that is, the interior sidewall surfaces 406, 408 of the recesses 402, 404 adjacent to the remaining source/drain extension regions 304, 306 are naturally formed such that they are aligned with the outward facing sides of the spacer 302 at the base of the spacer 302. For example, as best shown in FIG. 4, it appears as though the vertical sidewalls of spacer 302 continue downward to form the corresponding interior sidewall surfaces 406, 408 of the recesses 402, 404 that are proximate the gate structure 112 and/or the channel region. In this manner, the portions of the source/drain extension regions 304, 306 underlying the spacer 302 and/or gate structure 112 remain intact after the recesses 402, 404 are formed, while the exposed portions of the source/drain extension regions 304, 306 are removed by the etchant. For convenience, the remaining portions of the source/drain extension regions 304, 306 are referred to herein as source/drain extensions.

The recesses 402, 404 may be formed by anisotropically etching the exposed silicon material 104 using plasma-based RIE (reactive ion etching), using commonly known etchant chemistries such as, for example, $Cl_2$+HBr, HBr+$O_2$, or $Cl_2$+ HBr+$O_2$, which have the advantage of etching silicon with good selectivity to the nitride material of the spacer 302 and the gate cap 118, as well as any exposed field oxide 110. In an exemplary embodiment, the recesses 402, 404 are formed having a depth relative to the surface of the silicon material 104 less than the thickness of the silicon material 104 such that the underlying insulating material 108 is not exposed. In an exemplary embodiment, the depth of the recesses 402, 404 relative to the surface of the silicon material 104 is within the range of about 40 nm to about 90 nm. However, it will be appreciated that the depth of the recesses 402, 404 relative to the surface of the silicon material 104 will vary depending on the needs of a particular embodiment, and the subject matter described herein is not intended to be limited to any particular depth for the recesses 402, 404.

By virtue of the gate alignment and/or crystallographic orientation of the silicon material 104 described above, the interior sidewall surfaces 406, 408 of the recesses 402, 404 are substantially orthogonal to the <010> crystal direction of the silicon material 104, as illustrated by FIGS. 4-5. Thus, the interior sidewall surfaces 406, 408 are aligned with the {010} crystal plane in the semiconductor material 104 and the crystallographic orientation of the interior sidewall surfaces 406, 408 consists of the {010} crystal plane. Accordingly, the sidewall surfaces 406, 408 may alternatively be referred to herein as {010} surfaces. In this manner, interior boundaries of the silicon material 104 (e.g., boundaries of the source/drain extensions 304, 306 and/or channel region) adjacent to subsequently formed stressor regions consist of the {010} crystal plane of the silicon material 104. As used herein, the {100} crystal plane should be understood as referring to the family of equivalent crystal planes including the (010), (100), (001), ($0\bar{1}0$), ($\bar{1}00$), and ($00\bar{1}$) crystal planes. Thus, although the illustrated embodiment depicts the interior sidewall surfaces 406, 408 aligned with the (010) crystal plane, in other embodiments, the interior sidewall surfaces 406, 408 may be aligned with either of the (100) or (001) crystal planes, depending on the alignment of the gate structure 112 and the crystal orientation of the semiconductor material 104. In this manner, when the silicon material 104 comprises monocrystalline silicon having a face-centered cubic structure, the {010} surfaces are aligned with a face of a face-centered cube consisting of silicon atoms.

As best shown in FIG. 4, the bottom surfaces 410, 412 of the recesses 402, 404 are substantially orthogonal to the <001> crystal direction of the silicon material 104. Thus, the bottom surfaces 410, 412 are aligned with the {001} crystal plane in the semiconductor material 104 and the crystallographic orientation of bottom surfaces 410, 412 consists of the {001} crystal plane. Accordingly, the bottom surfaces 410, 412 may alternatively be referred to herein as {001} surfaces. As used herein, the {001} crystal plane should be understood as referring to the family of equivalent crystal planes including the (001), (100), (010), ($0\bar{1}0$), ($\bar{1}00$), and ($00\bar{1}$) crystal planes. Thus, although the illustrated embodiment depicts the bottom surfaces 410, 412 aligned with the (010) crystal plane, in other embodiments, the interior sidewall surfaces 406, 408 may be aligned with either of the (100) or (010) crystal planes, depending on the alignment of the gate structure 112 and the crystal orientation of the semiconductor material 104. In this manner, when the silicon material 104 comprises monocrystalline silicon having a face-centered cubic structure, the {001} surfaces are aligned with a face of a face-centered cube consisting of silicon atoms.

Thus, by virtue of the gate alignment and/or crystallographic orientation of the silicon material 104, the bottom surfaces 410, 412 and the sidewall surfaces 406, 408 consist of equivalent crystal planes of the silicon material 104. As a result, the growth rate and crystalline quality of stress-inducing semiconductor material epitaxially grown in the recesses 402, 404 is substantially the same for the {001} surfaces 410, 412 and the {010} surfaces 406, 408, resulting in relatively uniform stressor regions along the boundaries with the source/drain extensions 304, 306 and/or channel region, as described in greater detail below. In contrast, the conventional gate alignment (e.g., the width of the gate aligned with the <110> crystal direction) results in sidewall surfaces aligned with the {110} crystal plane that exhibit a relatively slower growth rate than the {001} bottom surfaces, and the material epitaxially grown on the {110} sidewall surfaces may grow defectively with a relatively rough morphology.

Figure 6:
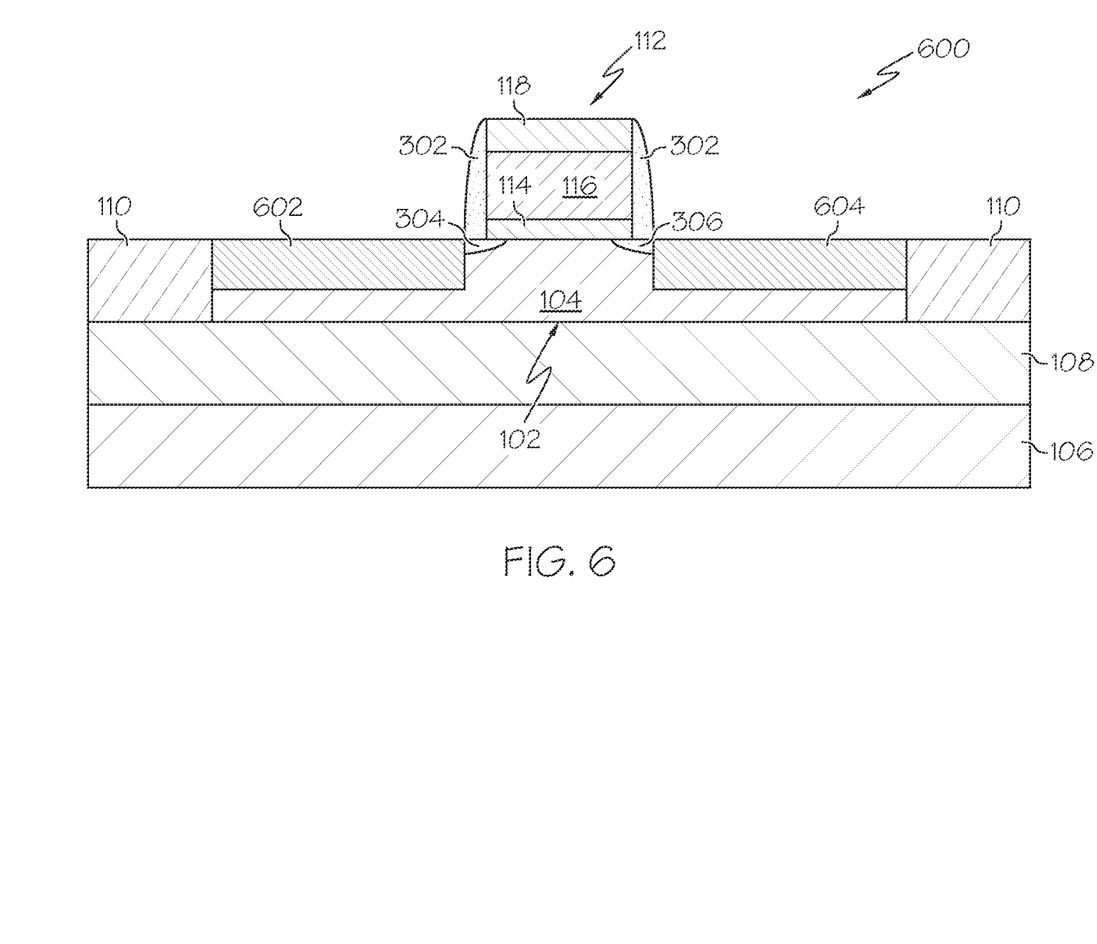

Referring now to FIG. 6, in an exemplary embodiment, the fabrication process continues by forming stressor regions 602, 604 in the recesses 402, 404, resulting in semiconductor device structure 600. The stressor regions 602, 604 are formed by growing a crystalline material having a different lattice constant than the host silicon material 104 on the exposed surfaces 406, 408, 410, 412 of silicon material 104 in the recesses 402, 404. The stressor regions 602, 604 are preferably formed by epitaxially growing a layer of stress-inducing semiconductor material in the recesses 402, 404. For example, when the silicon material 104 is doped to provide a P-well for a subsequently formed NMOS transistor structure, the stressor regions 602, 604 may be realized as a silicon carbon material having a smaller lattice constant than the silicon material 104 to apply a tensile longitudinal stress to the channel region and thereby increase the mobility of electrons in the channel region. Alternatively, for a PMOS transistor structure, the stressor regions 602, 604 may be realized as a silicon germanium material having a larger lattice constant than the silicon material 104 to apply a compressive longitudinal stress to the channel region and increase the mobility of holes in the channel region, as will be appreciated in the art.

In an exemplary embodiment, the fabrication process forms silicon carbon stressor regions 602, 604 (also referred to as embedded silicon carbon or eSi:C) by performing a cyclic epitaxial growth and etch back process. The cyclic growth and etch back process begins by epitaxially growing silicon carbon on the exposed surfaces 406, 408, 410, 412 of the silicon material 104 by the reduction of silane ($SiH_4$), disilane ($Si_2H_6$), dichlorosilane ($SiH_2Cl_2$), or another suitable silicon-comprising material in the presence of methane ($CH_4$), ethane ($C_2H_6$), or another suitable carbon-comprising material at a temperature between about 500° C. to about 800° C. In an exemplary embodiment, silicon carbon stressor regions 602, 604 include between about one percent to about three percent carbon. The growth rate and crystalline quality of the epitaxial silicon carbon is substantially the same for the {001} bottom surfaces 410, 412 and the {010} sidewall surfaces 406, 408, as described in greater detail below. In an exemplary embodiment, the silicon carbon stressor regions 602, 604 are in-situ doped by adding N-type impurity-doping elements, such as arsenic or phosphorous, to the reactants used to epitaxially grow the silicon carbon material. In this manner, source and drain regions for an NMOS transistor structure comprising gate structure 112 are comprised of the stressor regions 602, 604 and extensions 304, 306. For example, stressor region 602 and extension region 304 provide a first source/drain region, stressor region 604 and extension region 306 provide a second source/drain region, while the gate structure 112 provides the gate electrode for the NMOS transistor structure. In alternative embodiments, the stressor regions 602, 604 may be doped by subsequently implanting N-type ions in a similar manner as described above in the context of FIG. 3.

In practice, the epitaxial growth of silicon carbon is non-selective, and therefore, epitaxial growth of silicon carbon also occurs on any exposed surfaces of the field oxide 110, the spacer 302, and the gate cap 118. However, the silicon carbon grown on surfaces of the field oxide 110, the spacer 302, and the gate cap 118 is either amorphous or polycrystalline and of a lesser quality than the monocrystalline silicon carbon grown on the surfaces 406, 408, 410, 412 comprised of silicon material 104. Thus, the cyclic growth and etch back process continues by removing (or etching back) the silicon carbon material from the surfaces of the field oxide 110, the spacer 302, and the gate cap 118 using an isotropic etchant, such as hydrochloric acid. Due to the amorphous and/or polycrystalline crystal structure, the silicon carbon material on the surfaces of the field oxide 110, the spacer 302, and the gate cap 118 is more susceptible to the isotropic etchant than the monocrystalline silicon carbon grown on surfaces 406, 408, 410, 412. For example, the etch rate of the silicon carbon on the surfaces of the field oxide 110, the spacer 302, and the gate cap 118 is about five times the etch rate of the monocrystalline silicon carbon grown on the silicon material 104. In this manner, the crystalline structure of silicon carbon grown on the {010} sidewall surfaces 406, 408 is sufficiently resistant to the etchant, thereby inhibiting or otherwise preventing the etchant from removing portions of the source/drain extensions 304, 306 and/or the channel region, or from otherwise undercutting the spacer 302 when the silicon carbon is removed from surfaces of the field oxide 110, the spacer 302, and/or the gate cap 118. In this manner, silicon carbon is removed from the field oxide 110, the spacer 302, and the gate cap 118 while at least some of the silicon carbon on the {010} sidewall surfaces 406, 408 is retained and the source/drain extensions 304, 306 remain intact.

In an exemplary embodiment, one iteration of the deposition and etch back process results in a net growth of about two to three nanometers of silicon carbon in the recesses 402, 404 and zero net growth of silicon carbon on the field oxide 110, the spacer 302, and the gate cap 118. The fabrication of the semiconductor device structure 600 is achieved by repeating the epitaxial growth and etch back processes until the thickness of the silicon carbon stressor regions 602, 604 is greater than or equal to the depth of the recesses 402, 404 (e.g., a "flush" fill or slight overfill). After forming stressor regions 602, 604, fabrication of the semiconductor device overlying the isolated semiconductor region 102 may be completed using well known final process steps, and other back end process steps, which will not be described in detail herein. For example, the fabrication of an NMOS transistor structure from the semiconductor device structure 600 may by completed by performing additional processes, such as deep ion implantation, thermal annealing, formation of conductive contacts overlying the source/drain regions and/or gate structure, and/or other known process steps in a conventional manner.

The conventional gate alignment described above (e.g., the width of the gate aligned with the <110> crystal direction) results in {110} sidewall surfaces that exhibit a relatively slower growth rate for the silicon carbon than the {001} bottom surfaces. Additionally, the silicon carbon epitaxially grown on {110} surfaces tends to grow defectively with a relatively rough morphology. As a result, the etch rate for the silicon carbon on the {110} sidewall surfaces is greater than the etch rate for the silicon carbon on the {001} bottom surfaces, and therefore, more silicon carbon is removed from the {110} sidewall surfaces than the {001} bottom surfaces during the cyclic etch back process steps. As a result, the isotropic etch back process steps may undesirably etch the sidewall silicon material underneath the sidewall spacers and remove portions of the source/drain extensions, and in some cases, form voided regions along the upper surface of the silicon carbon stressor regions between the source/drain extensions and the stressor regions. That is, the upper surfaces of the source/drain extensions may not be adjacent to the stressor regions, but rather, may be separated by a dielectric material, such as an oxide or nitride material, deposited in subsequent process steps which, in turn, increases the extension resistance ($R_{EXT}$) of the device.

In contrast, by virtue of the gate alignment and/or crystallographic orientation of the silicon material 104 described herein, the growth rate and crystalline quality of the epitaxial silicon carbon is substantially the same on both the {001} bottom surfaces 410, 412 and the {010} sidewall surfaces 406, 408, which results in silicon carbon stressor regions 602, 604 having relatively uniform crystalline structure and/or quality along the boundaries with the source/drain extensions 304, 306 and/or the channel region. In this manner, the stressor regions 602, 604 have a void-free boundary with the source/drain extensions 304, 306, that is, the source/drain extensions 304, 306 are adjacent to the stressor regions 602, 604 along the upper surface of the semiconductor material 104.

Although FIGS. 1-6 illustrate exemplary embodiments for a (001) wafer, the subject matter described herein may be utilized with wafers having other crystallographic orientations. For example, if the wafer of semiconductor material is realized as a (110) wafer, the width of the gate structure may be aligned with the <100> family of crystal directions to provide recesses having sidewall surfaces and bottom surfaces comprised of equivalent crystal planes. In such an embodiment, the recesses may have sidewall surfaces consisting of the {110} family of equivalent crystal planes and bottom surfaces consisting of the {101} or {011} family of equivalent crystal planes. Thus, the sidewall surfaces may consist of one of the (110), (101), (011), ($\bar{1}\bar{1}$0), (0$\bar{1}\bar{1}$), ($\bar{1}$0$\bar{1}$), ($\bar{1}$10), (0$\bar{1}$1), ($\bar{1}$01), (1$\bar{1}$0), (01$\bar{1}$), or (10$\bar{1}$) crystal plane and the bottom surfaces may consist of one of the (110), (101), (011), ($\bar{1}\bar{1}$0), (0$\bar{1}\bar{1}$), ($\bar{1}$0$\bar{1}$), ($\bar{1}$10), (0$\bar{1}$1), ($\bar{1}$01), (1$\bar{1}$0), (01$\bar{1}$), or (10$\bar{1}$). As a result, the growth rate and crystalline quality of stress-inducing semiconductor material epitaxially grown in the recesses is substantially the same for the {110} bottom surfaces and the {110} sidewall surfaces, resulting in relatively uniform stressor regions along the boundaries with the source/drain extensions and/or channel region.

To briefly summarize, the silicon carbon stressor regions formed in accordance with the fabrication processes described herein have relatively uniform crystalline structure and/or quality along the interior boundaries with the source/drain extensions and/or channel region. The crystalline structure and/or quality and growth rate of the epitaxially grown stress-inducing semiconductor material is substantially the same for the sidewall surfaces and the bottom surfaces because they are comprised of equivalent crystal planes. As a result, the silicon carbon on the sidewall surfaces inhibits or otherwise prevents removal of the source/drain extensions and/or silicon material underneath the sidewall spacer, and thereby, prevents or otherwise reduces the extent of voided regions between the stressor regions and the source/drain extensions. As a result, due to the improved boundaries between stressor regions and source/drain extensions, NMOS transistors formed in accordance with the fabrication processes described herein are capable of achieving reduced extension resistance ($R_{EXT}$) and better drive current performance as compared to NMOS transistors having gates aligned in conventional directions.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
   a region of semiconductor material;
   a gate structure overlying the region of semiconductor material, wherein a width of the gate structure is aligned with a <100> crystal direction of the semiconductor material; and
   first and second stressor regions formed in the region of semiconductor material about the gate structure.

2. The semiconductor device of claim 1, further comprising:
   a first source/drain extension adjacent to the first stressor region, the first source/drain extension having a first conductivity type; and
   a second source/drain extension adjacent to the second stressor region, the second source/drain extension having the first conductivity type, wherein a channel region of semiconductor material underlying the gate structure has a second conductivity type and is disposed between the first source/drain extension and the second source/drain extension.

3. The semiconductor device of claim 2, wherein the <100> crystal direction is selected from a group consisting of a [100] crystal direction of the semiconductor material, a [010] crystal direction of the semiconductor material, and a [001] crystal direction of the semiconductor material.

4. The semiconductor device of claim 1, wherein a boundary of the semiconductor material adjacent to the first stressor region consists of a {010} crystal plane of the semiconductor material.

5. The semiconductor device of claim 1, wherein the gate structure has a length aligned with a <010> crystal direction of the semiconductor material.

6. The semiconductor device of claim 1, further comprising a spacer formed about sidewalls of the gate structure.

7. The semiconductor device of claim 1, wherein:
   the gate structure has the width aligned with a crystal direction selected from a group consisting of a [100] crystal direction of the semiconductor material, a [010] crystal direction of the semiconductor material, and a [001] crystal direction of the semiconductor material; and
   wherein a boundary of the semiconductor material adjacent to the first stressor region consists of a crystal plane selected from a group consisting of a (010) crystal plane of the semiconductor material, a (100) crystal plane of the semiconductor material, and a (001) crystal plane of the semiconductor material.

8. The semiconductor device of claim 1, wherein the stressor regions comprise epitaxially grown stress-inducing semiconductor material comprising silicon and carbon.

9. The semiconductor device of claim 1, further comprising:
   a spacer about sidewalls of the gate structure; and
   N-type ions implanted into the silicon material adjacent the spacer and the gate structure.

10. The semiconductor device of claim 1, further comprising N-type ions implanted into the silicon material adjacent the gate structure.

11. The semiconductor device of claim 10, wherein the stressor regions are further defined as silicon carbon stressor regions.

12. A semiconductor device comprising:
   a region of semiconductor material;
   a gate structure overlying the region of silicon material, wherein a width of the gate structure is aligned with a <100> crystal direction of the semiconductor material, wherein the <100> crystal direction is selected from a group consisting of a [100] crystal direction of the semiconductor material, a [010] crystal direction of the semiconductor material, and a [001] crystal direction of the semiconductor material, and wherein the gate structure has a length aligned with a <010> crystal direction of the semiconductor material;
   first and second stressor regions formed in the region of semiconductor material about the gate structure;
   a first source/drain extension adjacent to the first stressor region, the first source/drain extension having a first conductivity type;
   a second source/drain extension adjacent to the second stressor region, the second source/drain extension having the first conductivity type, wherein a channel region of semiconductor material underlying the gate structure has a second conductivity type and is disposed between the first source/drain extension and the second source/drain extension.

13. The semiconductor device of claim 12, wherein a boundary of the semiconductor material adjacent to the first stressor region consists of a {010} crystal plane of the semiconductor material.

14. The semiconductor device of claim 12, wherein the gate structure has a length aligned with a <010> crystal direction of the semiconductor material.

15. The semiconductor device of claim 12, further comprising a spacer formed about sidewalls of the gate structure.

16. The semiconductor device of claim 12, wherein the stressor regions comprise epitaxially grown stress-inducing semiconductor material comprising silicon and carbon.

17. The semiconductor device of claim 12, further comprising:
   a spacer about sidewalls of the gate structure; and
   N-type ions implanted into the silicon material adjacent the spacer and the gate structure.

18. The semiconductor device of claim 12, further comprising N-type ions implanted into the silicon material adjacent the gate structure.

19. The semiconductor device of claim 18, wherein the stressor regions are further defined as silicon carbon stressor regions.

20. A semiconductor device comprising:
- a region of semiconductor material;
- a gate structure overlying the region of silicon material, wherein a width of the gate structure is aligned with a <100> crystal direction of the semiconductor material, wherein the <100> crystal direction is selected from a group consisting of a [100] crystal direction of the semiconductor material, a [010] crystal direction of the semiconductor material, and a [001] crystal direction of the semiconductor material;
- a spacer about sidewalls of the gate structure; and
- first and second silicon carbon stressor regions formed in the region of semiconductor material about the gate structure and the spacers;
- a first source/drain extension adjacent to the first stressor region, the first source/drain extension having N-type ions therein;
- a second source/drain extension adjacent to the second stressor region, the second source/drain extension having the first conductivity type, wherein a channel region of semiconductor material underlying the gate structure has a second conductivity type and is disposed between the first source/drain extension and the second source/drain extension.

* * * * *